(12) United States Patent
Shijo et al.

(10) Patent No.: US 7,915,801 B2
(45) Date of Patent: Mar. 29, 2011

(54) METHOD OF MANUFACTURING OPTICAL ELEMENT AND METHOD OF MANUFACTURING RESIN-SEALED LIGHT EMITTING ELEMENT AS WELL AS OPTICAL ELEMENT, RESIN-SEALED LIGHT EMITTING ELEMENT AND PLANAR LIGHT SOURCE DEVICE

(75) Inventors: Masayuki Shijo, Yokohama (JP); Shunji Watanabe, Tokyo (JP)

(73) Assignee: Nikon Corporation, Tokyo (JP)

( * ) Notice: Subject to any disclaimer, the term of this patent is extended or adjusted under 35 U.S.C. 154(b) by 538 days.

(21) Appl. No.: 11/903,183

(22) Filed: Sep. 19, 2007

(65) Prior Publication Data
US 2008/0067911 A1 Mar. 20, 2008

Related U.S. Application Data

(60) Provisional application No. 60/848,647, filed on Oct. 3, 2006, provisional application No. 60/880,022, filed on Jan. 12, 2007.

(30) Foreign Application Priority Data

Sep. 20, 2006 (JP) ................................. 2006-254286
Jan. 5, 2007 (JP) ................................. 2007-000627

(51) Int. Cl.
*H01L 51/50* (2006.01)
*H01J 9/20* (2006.01)
(52) U.S. Cl. ........................... 313/498; 313/512; 445/58
(58) Field of Classification Search .................. 313/498, 313/499–504; 445/58
See application file for complete search history.

(56) References Cited

U.S. PATENT DOCUMENTS
6,639,356 B2 * 10/2003 Chin .............................. 313/499
(Continued)

FOREIGN PATENT DOCUMENTS
DE 2736534 2/1978
EP 0 632 511 A2 1/1995
EP 632511 A2 * 1/1995
(Continued)

OTHER PUBLICATIONS

The International Search Report and the Written Opinion of the International Searching Authority for PCT/JP2007/068315, 15 pages, mailed Jan. 28, 2008.

*Primary Examiner* — Bumsuk Won
*Assistant Examiner* — Nathaniel J Lee
(74) *Attorney, Agent, or Firm* — Klarquist Sparkman, LLP

(57) ABSTRACT

A method of manufacturing an optical element, comprising the steps of:
preparing a mold having concave portions for molding a first resin into an optical member having a predetermined shape as well as a plate-like member having through-holes in at least a part thereof and being made of a second resin, and then disposing the plate-like member on the top surface of the mold so that at least one through-hole can face the concave portion of the mold;
injecting a liquid precursor of the first resin into the space formed by the concave portion of the mold and the through-hole of the plate-like member so as to come into contact with at least a part of the plate-like member;
polymerizing the liquid precursor while maintaining the contacting state of the liquid precursor with the plate-like member; and
integratedly removing, from the mold, the plate-like member and the optical member made of the first resin which is the polymer of the liquid precursor, thereby to obtain an optical element.

25 Claims, 7 Drawing Sheets

| U.S. PATENT DOCUMENTS | | | | FOREIGN PATENT DOCUMENTS | | |
|---|---|---|---|---|---|---|
| 2002/0079837 A1 | 6/2002 | Okazaki | | JP | 57094706 | 6/1982 |
| 2004/0046242 A1* | 3/2004 | Asakawa | 257/678 | JP | 59045401 | 3/1984 |
| 2006/0066218 A1 | 3/2006 | Yamaguchi et al. | | JP | 2004-278888 | 9/2004 |
| 2006/0091788 A1* | 5/2006 | Yan | 313/502 | WO | WO 03/107319 A1 | 12/2003 |
| 2006/0105483 A1* | 5/2006 | Leatherdale et al. | 438/26 | | | |

* cited by examiner

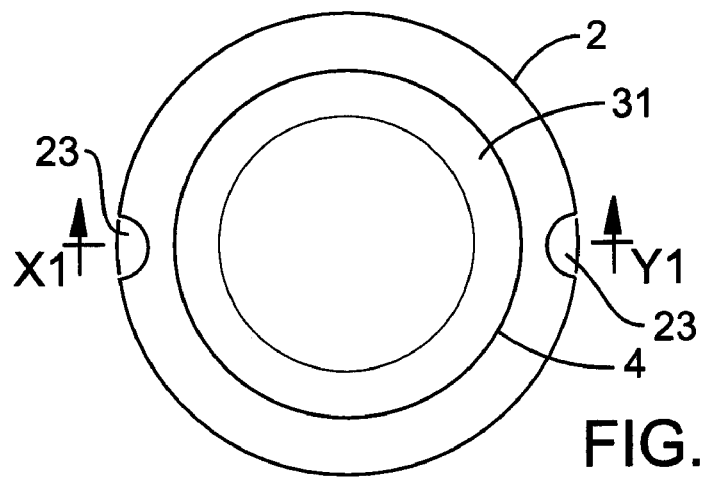
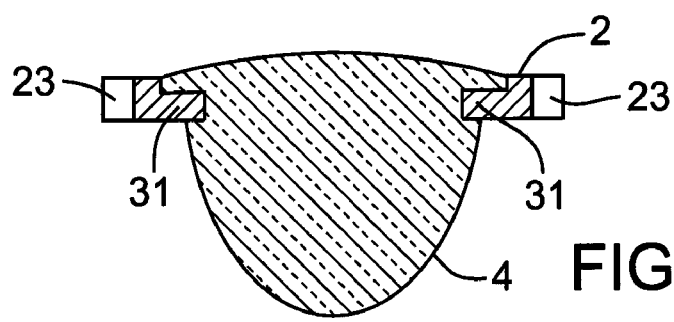
FIG. 2(a)
FIG. 2(b)
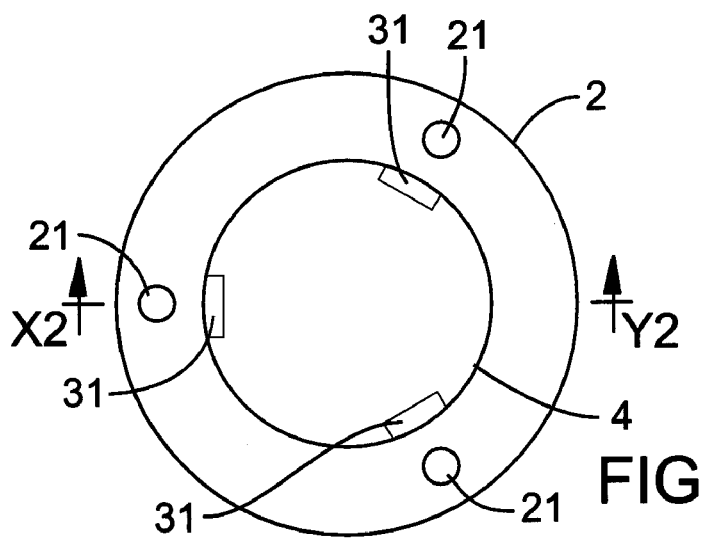
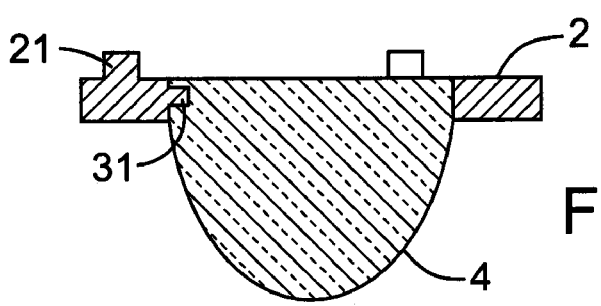
FIG. 3(a)
FIG. 3(b)

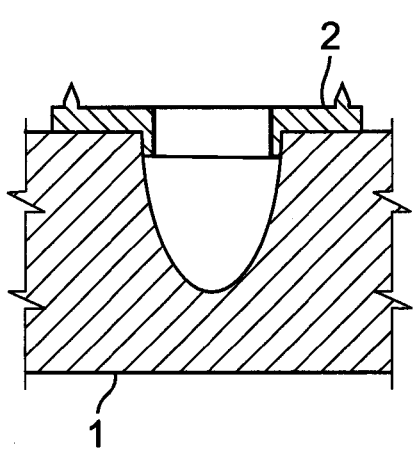 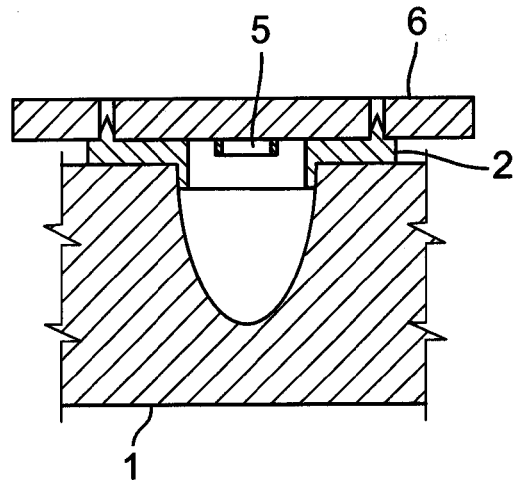
FIG. 6(a)   FIG. 6(b)
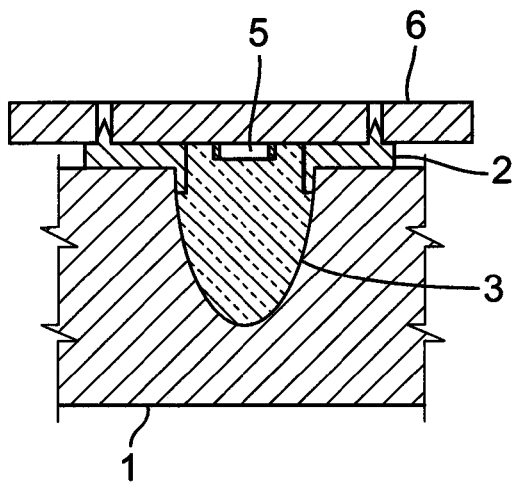 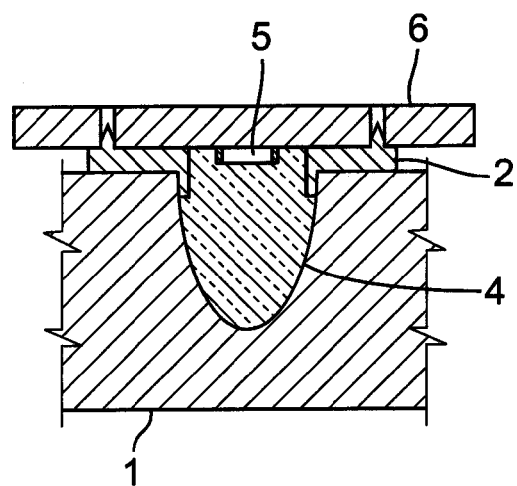
FIG. 6(c)   FIG. 6(d)
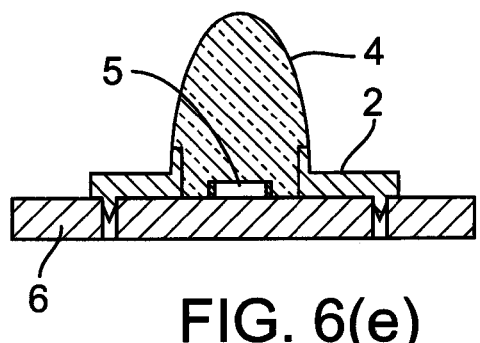
FIG. 6(e)

METHOD OF MANUFACTURING OPTICAL ELEMENT AND METHOD OF MANUFACTURING RESIN-SEALED LIGHT EMITTING ELEMENT AS WELL AS OPTICAL ELEMENT, RESIN-SEALED LIGHT EMITTING ELEMENT AND PLANAR LIGHT SOURCE DEVICE

CROSS REFERENCE TO RELATED APPLICATIONS

This application claims priority to, and the benefit of, U.S. Provisional Application No. 60/848,647, filed on Oct. 3, 2006, U.S. Provisional Application No. 60/880,022, filed on Jan. 12, 2007, Japan Patent Application No. JP2006-254286, filed on Sep. 20, 2006, and Japan Patent Application No. JP 2007-000627, filed on Jan. 5, 2007, all of which are incorporated herein in their respective entireties.

BACKGROUND OF THE INVENTION

1. Field of the Invention

The present invention relates to a method of manufacturing an optical element and a method of manufacturing a resin-sealed light emitting element as well as an optical element, a resin-sealed light emitting element and a planar light source device.

2. Related Background Art

Among light emitting elements, a light emitting diode (LED) element emits light as follows. Specifically, a p type semiconductor and an n type semiconductor are combined to each other, and then connected to an anode and a cathode, respectively. Subsequently, voltage is applied in the forward direction, and positive holes (holes) in the p type semiconductor are combined to electrons in the n type semiconductor near the pn junction, and thereby light is emitted.

The LED in which the LED element is sealed with resin is used for a projector and a backlight for a display. For example, International Publication No. WO03/107319 (WO 2003-107319 A) discloses a technique in which: LEDs for three primary colors, blue, green and red, are arranged; light emitting elements project the colored lights onto a distant liquid crystal panel to produce white light; and the white light is utilized as a backlight for a display.

In such an applied technique as described in WO 2003-107319 A, LED elements are combined to optical members molded from a sealing resin so as to function in any case. Accordingly, it is important to accurately position LED elements and the optical members in relation to each other. Moreover, it is also important to orderly dispose multiple LEDs and other optical elements in array.

However, there are the following problems in such a technique. The operation of accurately positioning the LED elements and the optical members molded from the sealing resin is inefficient. Moreover, it is particularly difficult to mold a thermosetting resin with a high refractive index into a finer size at the stage of polymerization. When resin-sealed light emitting elements are manufactured by combining the light emitting elements, such as the LED elements, to the optical members, such as a lens made of the thermosetting resin, the assembly is difficult. This is because it is impossible to form positioning means on the optical members, the positioning means being for accurately positioning both the light emitting elements and the optical members in relation to each other. Furthermore, in the case of arranging the multiple LEDs and the other optical elements in array, it is necessary to position the optical members molded from the sealing resin in relation to the multiple LED elements which are fixed to the surface of an element substrate in a predetermined alignment. This adds an even more inefficient operation to the manufacturing process.

SUMMARY OF THE INVENTION

The present invention is made in consideration of the problems of the conventional technique. An object of the present invention is to provide: a method of manufacturing a resin-sealed light emitting element by which an operation of, for example, the positioning of a light emitting element and an optical member, can be achieved efficiently and reliably; a resin-sealed light emitting element and a planar light source device obtained by the method; an optical element which can be suitable for being used in the method; and a manufacturing method of the optical element.

The inventors of this invention have been engaged in keen studies so as to achieve the object. As a result, the inventors have discovered the following fact, and then completed the present invention. The fact is that it is possible to efficiently and reliably perform an operation of, for example, positioning a light emitting element and an optical member by using a certain plate-like member made of a certain resin, in addition to the material of the optical member, in the method of manufacturing a resin-sealed light emitting element which includes a light emitting element and an optical member molded from a sealing resin.

A method of manufacturing an optical element according to the present invention comprises the steps of:

preparing a mold having concave portions for molding a first resin into an optical member in a predetermined shape as well as a plate-like member having through-holes in at least a part thereof and made of a second resin, and then disposing the plate-like member on the top surface of the mold so that at least one through-hole can face the concave portion of the mold;

injecting a liquid precursor of the first resin into the space formed by the concave portion of the mold and the through-hole of the plate-like member so as to come into contact with at least a part of the plate-like member;

polymerizing the liquid precursor while maintaining the contacting state of the liquid precursor with the plate-like member; and integratedly removing, from the mold, the plate-like member and the optical member made of the first resin, which is the polymer of the liquid precursor, thereby to obtain an optical element.

Additionally, in the method of manufacturing an optical element according to the present invention, the step of disposing the plate-like member on the top surface of the mold may be a step of disposing so that the plurality of through-holes of the plate-like member can respectively face the plurality of concave portions of the mold.

Furthermore, in the method of manufacturing an optical element according to the present invention, the polymerization temperature of the liquid precursor is preferably lower than the heat distortion temperature of the second resin by 20° C. or more.

Moreover, in the method of manufacturing an optical element according to the present invention, the refractive index of the first resin is preferably 1.6 to 1.8.

Furthermore, in the method of manufacturing an optical element according to the present invention, the first resin is preferably at least one resin selected from the group consisting of a thiourethane resin and an episulfide resin.

Additionally, in the method of manufacturing an optical element according to the present invention, the first resin is preferably an episulfide resin, and the second resin is preferably a polycarbonate resin.

Furthermore, in the method of manufacturing an optical element according to the present invention, when the plate-like member is disposed on the top surface of the mold, the plate-like member is disposed in a predetermined position preferably using first positioning means which are provided to the plate-like member and the mold, and which determine the positions of the concave portion of the mold and the plate-like member relative to each other.

Moreover, in the method of manufacturing an optical element according to the present invention, the first positioning means may be optically readable alignment marks.

Furthermore, in the method of manufacturing an optical element according to the present invention, the plate-like member is preferably provided with a convex portion formed on at least a part of the inner wall surface of the through-hole.

Additionally, in the method of manufacturing an optical element according to the present invention, when the liquid precursor of the first resin is injected into the space formed by the concave portion of the mold and the through-hole of the plate-like member, the liquid precursor of the first resin is preferably injected into the space so that the liquid precursor of the first resin can cover the convex portion formed on the inner wall surface of the through-hole.

Still furthermore, in the method of manufacturing an optical element according to the present invention, the first positioning means may be made of the combination of a concave portion and a convex portion which fit to each other in a predetermined position.

A first method of manufacturing a resin-sealed light emitting element according to the present invention comprises the steps of:

preparing a mold having concave portions for molding a first resin into an optical member in a predetermined shape as well as a plate-like member having through-holes in at least a part thereof and made of a second resin, and then disposing the plate-like member on the top surface of the mold so that at least one through-hole can face the concave portion of the mold;

disposing a light emitting element in the space formed by the concave portion of the mold and the through-hole of the plate-like member;

injecting a liquid precursor of the first resin into the space so as to come into contact with at least a part of the plate-like member and at least a part of the light emitting element;

polymerizing the liquid precursor while maintaining the contacting state of the liquid precursor with the plate-like member and the light emitting element; and integratedly removing, from the mold, the plate-like member, the light emitting element and the optical member made of the first resin which is the polymer of the liquid precursor, thereby to obtain a resin-sealed light emitting element.

Additionally, in the first method of manufacturing a resin-sealed light emitting element according to the present invention, the step of disposing the plate-like member on the top surface of the mold may be a step of disposing a plurality of light emitting elements fixed on an element substrate in a predetermined alignment in the plurality of spaces formed by the concave portions of the mold and the through-holes of the plate-like member, which are formed as corresponding to the alignment of the light emitting elements.

Furthermore, in the first method of manufacturing a resin-sealed light emitting element according to the present invention, the light emitting element is preferably a light emitting diode element.

Moreover, in the first method of manufacturing a resin-sealed light emitting element according to the present invention, the polymerization temperature of the liquid precursor is preferably lower than the heat distortion temperature of the second resin by 20° C. or more.

Furthermore, in the first method of manufacturing a resin-sealed light emitting element according to the present invention, the refractive index of the first resin is preferably 1.6 to 1.8.

Additionally, in the first method of manufacturing a resin-sealed light emitting element according to the present invention, the first resin is preferably at least one resin selected from the group consisting of a thiourethane resin and an episulfide resin.

Furthermore, in the first method of manufacturing a resin-sealed light emitting element according to the present invention, the first resin is preferably an episulfide resin, and the second resin is preferably a polycarbonate resin.

Moreover, in the first method of manufacturing a resin-sealed light emitting element according to the present invention, when the plate-like member is disposed on the top surface of the mold, the plate-like member is disposed in a predetermined position preferably using first positioning means which are provided to the plate-like member and the mold, and which determine the positions of the concave portion of the mold and the plate-like member relative to each other.

Furthermore, in the first method of manufacturing a resin-sealed light emitting element according to the present invention, when the light emitting element is disposed in the space formed by the concave portion of the mold and the through-hole of the plate-like member, the light emitting element is disposed in a predetermined position preferably using second positioning means which are provided to the light emitting element as well as at least one of the mold and the plate-like member, and which determine the positions of the plate-like member and the light emitting element relative to each other.

Additionally, in the first method of manufacturing a resin-sealed light emitting element according to the present invention, the positioning means may be optically readable alignment marks.

Furthermore, in the first method of manufacturing a resin-sealed light emitting element according to the present invention, the positioning means may be made of the combination of a concave portion and a convex portion which fit to each other in a predetermined position.

Moreover, in the first method of manufacturing a resin-sealed light emitting element according to the present invention, the plate-like member is preferably provided with a convex portion formed on at least a part of the inner wall surface of the through-hole.

Still furthermore, in the first method of manufacturing a resin-sealed light emitting element according to the present invention, when the liquid precursor of the first resin is injected into the space formed by the concave portion of the mold and the through-hole of the plate-like member, the liquid precursor of the first resin is preferably injected into the space so that the liquid precursor of the first resin can cover the convex portion formed on the inner wall surface of the through-hole.

A second method of manufacturing a resin-sealed light emitting element according to the present invention comprises the steps of:

obtaining an optical element by the above-mentioned method of manufacturing an optical element;

disposing a light emitting element to one surface of the optical member made of a first resin in the optical element with the liquid precursor of the first resin interposed therebetween; and polymerizing the liquid precursor thereby to obtain a resin-sealed light emitting element.

Additionally, in the second method of manufacturing a resin-sealed light emitting element according to the present invention, when the light emitting element is disposed to the one surface of the optical member, the light emitting element is disposed in a predetermined position preferably using second positioning means which are provided to the light emitting element and the plate-like member made of the second resin in the optical element, and which determine the positions of the plate-like member and the light emitting element relative to each other.

Furthermore, in the second method of manufacturing a resin-sealed light emitting element according to the present invention, the second positioning means may be optically readable alignment marks.

Moreover, in the second method of manufacturing a resin-sealed light emitting element according to the present invention, the second positioning means may be made of the combination of a concave portion and a convex portion which fit to each other in a predetermined position.

Still furthermore, in the second method of manufacturing a resin-sealed light emitting element according to the present invention, the second positioning means may be made of the combination of a straight-lined edge provided to at least a part of the plate-like member and the shape which fits to the straight-lined edge.

An optical element for a resin-sealed light emitting element according to the present invention comprises: an optical member made of a first resin; and a plate-like member which is bound to the surface of at least a part of the optical member, but not to a light emitting surface thereof, and which is made of a second resin, wherein the refractive index of the first resin is 1.6 to 1.8, and the second resin is a thermoplastic resin.

Additionally, in the optical element according to the present invention, the heat distortion temperature of the second resin is preferably 100° C. or higher.

Furthermore, in the optical element according to the present invention, the first resin is preferably at least one resin selected from the group consisting of a thiourethane resin and an episulfide resin.

Moreover, in the optical element according to the present invention, the first resin is preferably an episulfide resin, and the second resin is preferably a polycarbonate resin.

Furthermore, in the optical element according to the present invention, the plate-like member may include an optically readable alignment mark.

Additionally, in the optical element according to the present invention, the plate-like member may include any one of a concave portion and a convex portion for positioning.

Furthermore, in the optical element according to the present invention, the plate-like member preferably has a through-hole in at least a part thereof, and then at least a part of the inner wall surface of the through-hole is preferably bound to the optical member.

Moreover, in the optical element according to the present invention, the plate-like member is preferably provided with a convex portion formed on at least a part of the inner wall surface of the through-hole.

A resin-sealed light emitting element according to the present invention comprises: a light emitting element; an optical member which embeds the light emitting element therein, and which is made of a first resin; and a plate-like member which is bound to at least a part of the surface of the optical member, but not to a light emitting surface thereof, and which is made of a second resin, wherein the refractive index of the first resin is 1.6 to 1.8, and the second resin is a thermoplastic resin.

Additionally, in the resin-sealed light emitting element according to the present invention, the heat distortion temperature of the second resin is preferably 100° C. or higher.

Furthermore, in the resin-sealed light emitting element according to the present invention, the first resin is preferably at least one resin selected from the group consisting of a thiourethane resin and an episulfide resin.

Moreover, in the resin-sealed light emitting element according to the present invention, the first resin is preferably an episulfide resin, and the second resin is preferably a polycarbonate resin.

Furthermore, in the resin-sealed light emitting element according to the present invention, the light emitting element is preferably a light emitting diode element.

Additionally, in the resin-sealed light emitting element according to the present invention, the plate-like member preferably has a through-hole in at least a part thereof, and at least a part of the inner wall surface of the through-hole is preferably bound to the optical member.

Still furthermore, in the resin-sealed light emitting element according to the present invention, the plate-like member is preferably provided with a convex portion formed on at least a part of the inner wall surface of the through-hole.

A planar light source device according to the present invention comprises: an element substrate; and the resin-sealed light emitting element, wherein the plurality of resin-sealed light emitting elements are fixed to the surface of the element substrate in a predetermined alignment.

By means of the method of manufacturing a resin-sealed light emitting element according to the present invention it is possible to efficiently and reliably perform an operation to position a light emitting element and an optical member, for example. Specifically, in the method of manufacturing a resin-sealed light emitting element which includes a light emitting element and an optical member, it is not always a simple operation to seal a light emitting element with a sealing resin. Particularly, an operation of accurately positioning the light emitting element and the optical member molded from a sealing resin is inefficient. In contrast, in the method of manufacturing a resin-sealed light emitting element according to the present invention, the plate-like member made of the second resin is used in addition to the liquid precursor of the first resin serving as a material of the optical member. Furthermore, the plate-like member can be provided with, for example, the positioning means. By use of the positioning means, it is possible to efficiently and reliably perform the positioning of the light emitting element and the optical member molded from the sealing resin.

Moreover, the method of manufacturing a resin-sealed light emitting element according to the present invention can be used even when multiple light emitting elements are fixed to the surface of the element substrate. Even in this case, the plate-like member can be provided with the positioning means. By use of the positioning means, it is possible to efficiently and reliably perform the positioning of the multiple light emitting elements and the multiple optical members. Accordingly, the present invention makes it possible to efficiently and reliably obtain a planar light source device in which the multiple resin-sealed light emitting elements are fixed to the surface of the element substrate in a predetermined alignment.

According to the present invention, it is possible to provide: a method of manufacturing a resin-sealed light emitting element by which an operation, for example, the positioning of a light emitting element and an optical member, can be achieved efficiently and reliably; a resin-sealed light emitting element and a planar light source device obtained by the method; an optical element which can be suitable for being used in the method; and a manufacturing method of the optical element.

BRIEF DESCRIPTION OF THE DRAWINGS

FIG. 2(a) is a schematic top view showing a preferred embodiment of an optical element according to the present invention. FIG. 2(b) is a schematic cross-sectional view taken along the line X1-Y1 in FIG. 2(a).

FIG. 3(a) is a schematic top view showing another preferred embodiment of the optical element according to the present invention. FIG. 3(b) is a schematic cross-sectional view taken along the line X2-Y2 in FIG. 3(a).

FIG. 6 is a schematic view showing the steps of a preferred embodiment of a first method of manufacturing a resin-sealed light emitting element according to the present invention (FIG. 6(a) corresponds to the first step; FIG. 6(b) corresponds to the second step; FIG. 6(c) corresponds to the third step; FIG. 6(d) corresponds to the fourth step; FIG. 6(e) corresponds to the fifth step).

DETAILED DESCRIPTION OF THE PREFERRED EMBODIMENTS

Figure 1A:
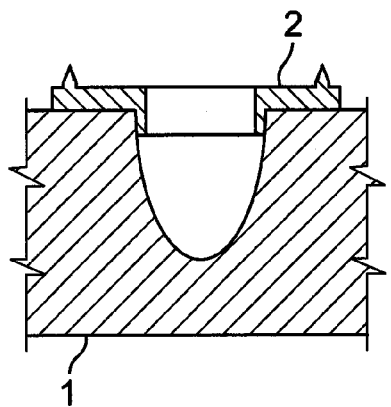
FIG. 1 is a schematic view showing the steps of a preferred embodiment of a method of manufacturing an optical element according to the present invention (FIG. 1(a) corresponds to the first step.
FIG. 1(b) corresponds to the second step.
FIG. 1(c) corresponds to the third step.
FIG. 1(d) corresponds to the fourth step).

Hereinafter, description will be given of preferred embodiments of the present invention in detail with reference to the drawings. Note that, the same or corresponding constituents are denoted by the same numerals and symbols in the following description and drawings, and the overlapped description is omitted.

<Method of Manufacturing Optical Element>

First of all, description will be given of a method of manufacturing an optical element according to the present invention. Specifically, the method of manufacturing an optical element according to the present invention comprises:

a step of preparing a mold having concave portions for molding a first resin into an optical member in a predetermined shape as well as a plate-like member having through-holes in at least a part thereof and made of a second resin, and then disposing the plate-like member on the top surface of the mold so that at least one through-hole can face the concave portion of the mold (first step);

a step of injecting a liquid precursor of the first resin into the space formed by the concave portion of the mold and the through-hole of the plate-like member so that the liquid precursor can come into contact with at least a part of the plate-like member (second step);

a step of polymerizing the liquid precursor while maintaining the contacting state of the liquid precursor with the plate-like member (third step); and a step of integratedly removing, from the mold, the plate-like member and the optical member made of the first resin which is the polymer of the liquid precursor thereby to obtain an optical element (fourth step).

Firstly, description will be given of the first resin and the second resin used in the method of manufacturing an optical element according to the present invention. The first resin used in the method of manufacturing an optical element according to the present invention is a material of the optical member according to the present invention. As the first resin, a known resin for optical materials can be used appropriately. However, from the viewpoint of reducing the focal length of the optical member in order to further reduce the optical system in size, a resin with a high refractive index is preferably used, and more precisely, a resin with a refractive index in a range of 1.6 to 1.8 is preferably used. The first resin can be, for example, a thiourethane resin or an episulfide resin. The resin can be used alone, or in combination of two or more kinds, as the first resin.

Meanwhile, the second resin used in the method of manufacturing an optical element according to the present invention is a material of the plate-like member according to the present invention. From the viewpoint of the productivity, the second resin is preferably a thermoplastic resin which is capable of forming a plate-like member by the injection-molding method. Moreover, a resin with a heat distortion temperature of 100° C. or higher is preferably used as the second resin from the viewpoint of not causing the change in the plate-like member other than the change in the shape due to the linear expansion in the third step to be described below. Note that, the heat distortion temperature can be measured in accordance with the method described in ASTM D648 or the method described in JIS K7191-1 and 2. The second resin including above-mentioned characteristics can be, for, example, a polycarbonate resin (PC), a polyphenylene sulfide resin (PPS), a norbornene resin, a cyclic olefin copolymer, an alicyclic acrylic resin, an polyacetal, an polybutylene terephthalate, a modified polyphenylene oxide, and an ultra high molecular weight polyethylene. These resins can be used alone, or in combination of two or more kinds, as the second resin.

Furthermore, from the viewpoint of the adhesiveness between the first resin and the second resin in the method of manufacturing an optical element according to the present invention, the first resin is preferably at least one resin selected from the group consisting of a thiourethane resin and an episulfide resin. Meanwhile, the second resin is preferably at least one resin selected from the group consisting of a polycarbonate resin, an alicyclic acrylic resin and a polybutylene terephthalate. The first resin is particularly preferably an episulfide resin, and the second resin is particularly preferably a polycarbonate resin.

Additionally, these first and second resins may contain a dye to reduce yellow or red coloring due to the initial color defect or light irradiation, an ultraviolet absorbent, an antioxidant, an internal mold release agent, an internal adhesive improver, a polymerization catalyst, and other known performance-improving additives, as necessary.

Figure 1B:
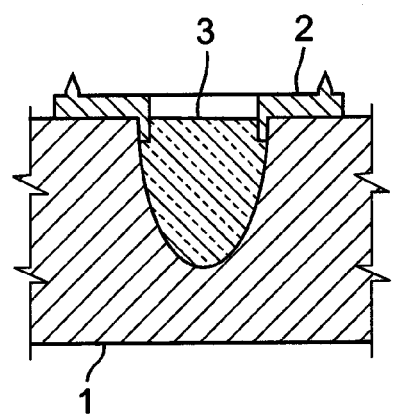
Figure 1C:
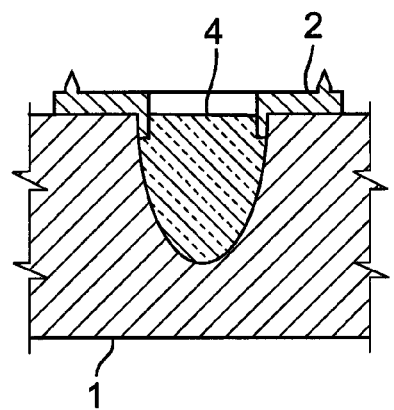
Figure 1D:
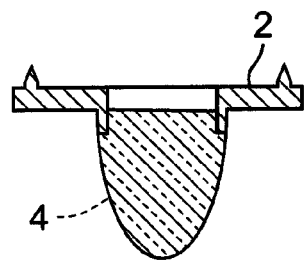

Hereinabove, the description has been given of the first resin and the second resin used in the method of manufacturing an optical element according to the present invention. Hereinafter, description will be given of the method of manufacturing an optical element according to the present invention with reference to FIG. 1(a) to FIG. 1(d). FIG. 1(a) to FIG. 1(d) are schematic views showing a preferred embodiment of the first to fourth steps in the method of manufacturing an optical element according to the present invention. FIG. 1(a) corresponds to the first step. FIG. 1(b) corresponds to the second step. FIG. 1(c) corresponds to the third step. FIG. 1(d) corresponds to the fourth step.

In the first step, firstly, prepared are a mold 1 having concave portions for molding a first resin into an optical member in a predetermined shape as well as a plate-like member 2 having through-holes in at least a part thereof and being made of a second resin. As the mold 1, a known steel can be used appropriately, and the surface thereof may be coated with, for example, a chromium-based material, a titanium-based material, a boron-based material or a carbon-based material. Additionally, the plate-like member 2 to be used is made of the second resin having the through-holes in at least a part thereof. Since the plate-like member 2 has the through-holes in at least a part thereof, a liquid precursor 3 of the first resin can be injected through the through-holes in the second step to be described below. In the first step, subsequently, the plate-like member 2 is disposed on the top surface of the mold 1 so that at least one through-hole can face the concave portion of the mold 1 as shown in FIG. 1(a).

Note that, in the method of manufacturing an optical element according to the present invention, when the plate-like member 2 is disposed on the top surface of the mold 1, it is preferable to use first positioning means provided to the plate-like member 2 and the mold 1 for determining the positions of the mold 1 and the plate-like member 2 relative to each other, in order to dispose the plate-like member 2 in a predetermined position. Thus, it is possible to efficiently and reliably perform the positioning of the plate-like member 2 and an optical member molded with the mold 1 to be described below. Furthermore, the first positioning means are not particularly limited to a specific kind, and may be optically readable alignment marks, or may be made of the combination of a concave portion and a convex portion which fit to each other in a predetermined position. These positioning means can be used alone or in combination of two or more kinds.

In the second step, firstly, the liquid precursor 3 of the first resin is prepared. As the liquid precursor 3, a precursor composition with a liquid form containing a material of the first resin can be used. For example, when the first resin is a thiourethane resin, the liquid precursor 3 can be a liquid precursor composition containing, as the main components, an isocyanate compound having two or more isocyanato groups and a thiol compound having two or more mercapto groups. Meanwhile, when the first resin is an episulfide resin, the liquid precursor 3 can be a liquid precursor composition containing an episulfide compound having two or more episulfide groups as the main component.

Subsequently, in the second step, the liquid precursor 3 is injected into the space formed by the concave portion of the mold 1 and the through-hole of the plate-like member 2 so as to come into contact with at least a part of the plate-like member as shown in FIG. 1(b).

In the third step, the liquid precursor 3 is polymerized while maintaining the contacting state of the liquid precursor 3 with the plate-like member. The polymerization temperature of the liquid precursor 3 varies with the type of the liquid precursor 3 to be used, and thus is not particularly limited to a specific kind. However, from the viewpoint of not causing the change in the plate-like member 2 other than the change in the shape due to the linear expansion, the polymerization temperature is preferably lower than the heat distortion temperature of the second resin by 20° C. or more, and more preferably within a range of 80° C. to 100° C. Moreover, the polymerization time for the liquid precursor 3 is preferably within a range of 30 minutes to 240 minutes. By polymerizing the liquid precursor 3 as described above, it is possible to mold an optical member 4 made of the first resin which is the polymer of the liquid precursor 3, and also to bind the plate-like member 2 to the surface of at least a part of an optical member 4 (see FIG. 1(c)).

In the fourth step, the plate-like member 2 and the optical member 4 made of the first resin which is the polymer of the liquid precursor 3 are integratedly removed from the mold, and thereby an optical element is obtained. Accordingly, it is possible to obtain an optical element which comprises, as shown in FIG. 1(d): the optical member 4; and the plate-like member 2 bound to the surface of at least a part of the optical member 4, but not to a light emitting surface thereof.

Hereinabove, the description has been given of the preferred embodiment of the method of manufacturing an optical element according to the present invention. However, the method of manufacturing an optical element according to the present invention is not limited to this embodiment. For example, in the method of manufacturing an optical element according to the present invention, the first step may be a step of disposing the multiple through-holes of the plate-like member 2 respectively to the multiple concave portions of the mold 1 so that each through-hole can face the corresponding concave portion. Thus, multiple optical elements can be manufactured simultaneously.

Furthermore, in the method of manufacturing an optical element according to the present invention, the plate-like member 2 may be provided with a convex portion formed on at least a part of the inner wall surface of the through-hole. Moreover, in a case where this plate-like member 2 is used, when the liquid precursor 3 of the first resin is injected into the space formed by the concave portion of the mold and the through-hole of the plate-like member 2, it is preferable to inject the liquid precursor 3 of the first resin into the space so that the liquid precursor 3 of the first resin can cover the convex portion formed on the inner wall surface of the through-hole. Thus, it is possible to further improve the adhesiveness between the optical member 4 and the plate-like member 2.

Additionally, the optical element thus obtained can be, for example, optical elements as shown in FIG. 2 to FIG. 5. FIG. 2(a) is a schematic top view showing a preferred embodiment of the optical element according to the present invention. FIG. 2(b) is a schematic cross-sectional view taken along the line X1-Y1 in FIG. 2(a). In the optical element shown in FIG. 2, a convex portion 31 in a cylindrical shape, which is formed on the inner wall surface of the through-hole of the plate-like member 2, is covered by the optical member 4 made of the first resin. Accordingly, the adhesiveness between the optical member 4 and the plate-like member 2 is further improved. Moreover, the optical element shown in FIG. 2 includes concave portions 23 for positioning to a light emitting element 5 to be described later. Note that, a post-treatment of grinding the unnecessary portion of the optical member 4 may be performed on the optical element as needed.

FIG. 3(a) is a schematic top view showing another preferred embodiment of the optical element according to the present invention. FIG. 3(b) is a schematic cross-sectional view taken along the line X2-Y2 in FIG. 3(a). In the optical element shown in FIG. 3, convex portions 31, which is formed on at least a part of the inner wall surface of the through-hole of the plate-like member 2, are covered by the optical member 4 made of the first resin. Accordingly, the adhesiveness between the optical member 4 and the plate-like member 2 is further improved, and also the optical member 4 does not rotate around the symmetry axis. Moreover, the optical element shown in FIG. 3 includes convex portions 21 for positioning to a light emitting element 5 to be described later.

Figure 4A:
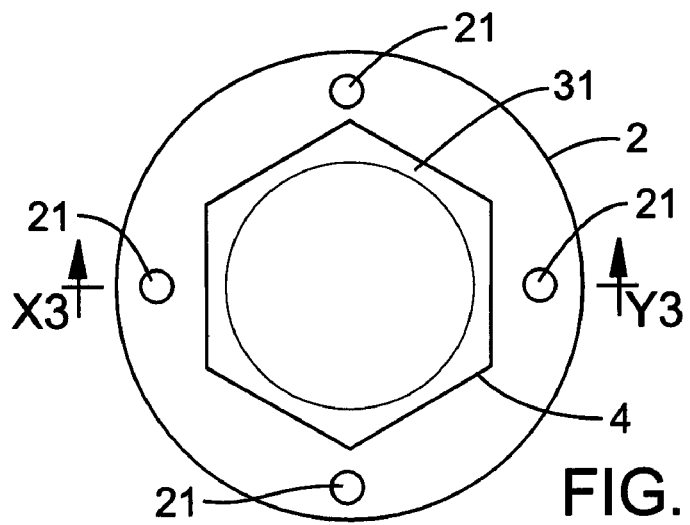
FIG. 4(a) is a schematic top view showing still another preferred embodiment of the optical element according to the present invention.
Figure 4B:
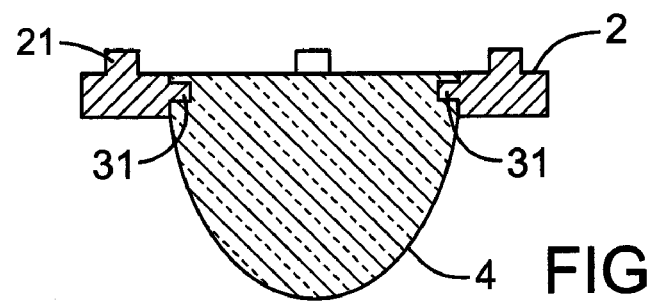
FIG. 4(b) is a schematic cross-sectional view taken along the line X3-Y3 in FIG. 4(a).

FIG. 4(a) is a schematic top view showing still another preferred embodiment of the optical element according to the present invention. FIG. 4(b) is a schematic cross-sectional view taken along the line X3-Y3 in FIG. 4(a). In the optical element shown in FIG. 4, a convex portion 31 in a cylindrical shape, which is formed on the inner wall surface of a regular-hexagonal-shaped through-hole of the plate-like member 2, is covered by the optical member 4 made of the first resin. Accordingly, the adhesiveness between the optical member 4 and the plate-like member 2 is further improved, and also the optical member 4 does not rotate around the symmetry axis. Moreover, the optical element shown in FIG. 4 includes convex portions 21 for positioning to a light emitting element 5 to be described later.

Figure 5A:
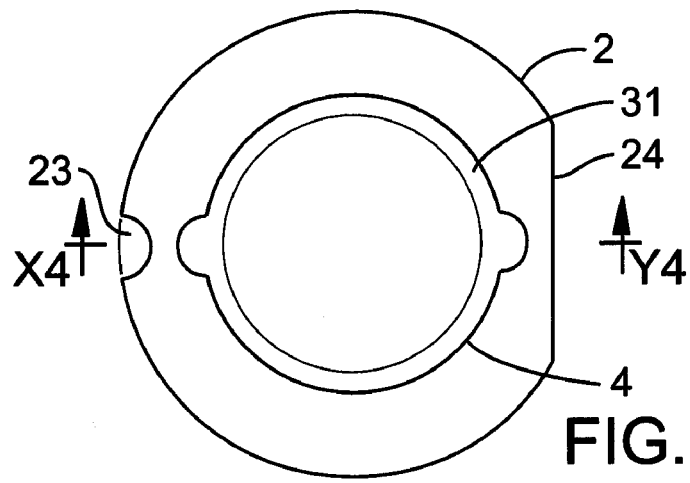
FIG. 5(a) is a schematic top view showing still yet another preferred embodiment of the optical element according to the present invention.
Figure 5B:
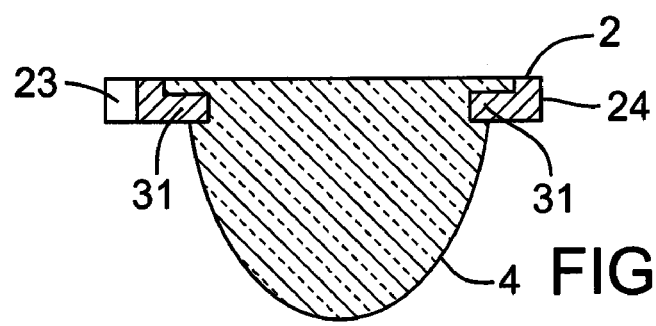
FIG. 5(b) is a schematic cross-sectional view taken along the line X4-Y4 in FIG. 5(a).
Figure 7A:
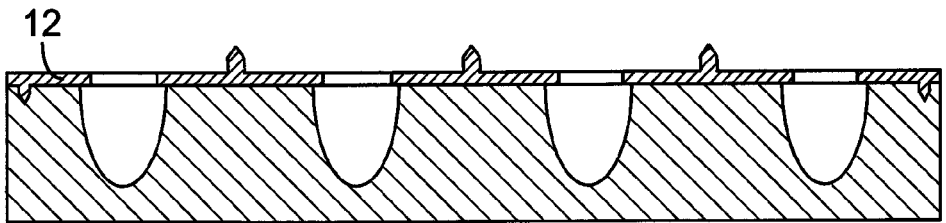
FIG. 7 is a schematic view showing the steps of another preferred embodiment of the first method of manufacturing a resin-sealed light emitting element according to the present invention (FIG. 7(a) corresponds to the first step.
FIG. 7(b) corresponds to the second step.
FIG. 7(c) corresponds to the third step.
FIG. 7(d) corresponds to the fourth step.
FIG. 7(e) corresponds to the fifth step).
Figure 7B:
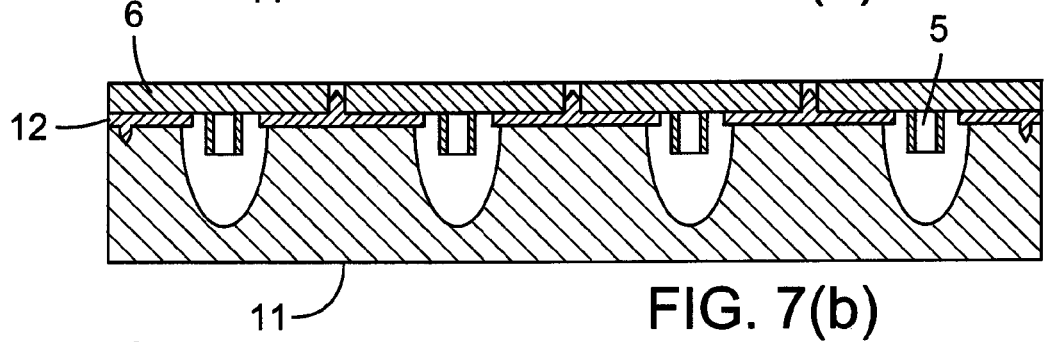
Figure 7C:
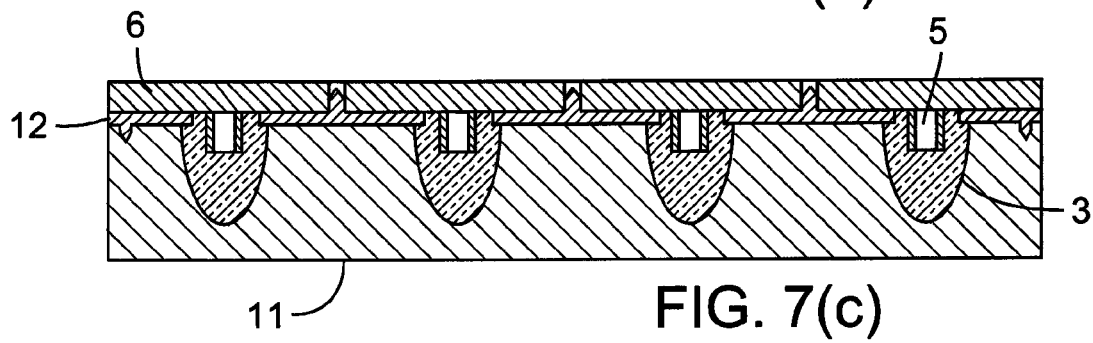
Figure 7D:
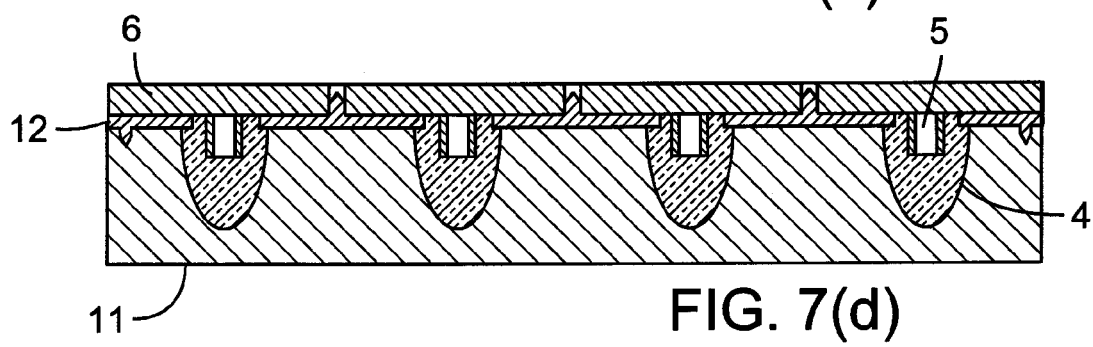
Figure 7E:
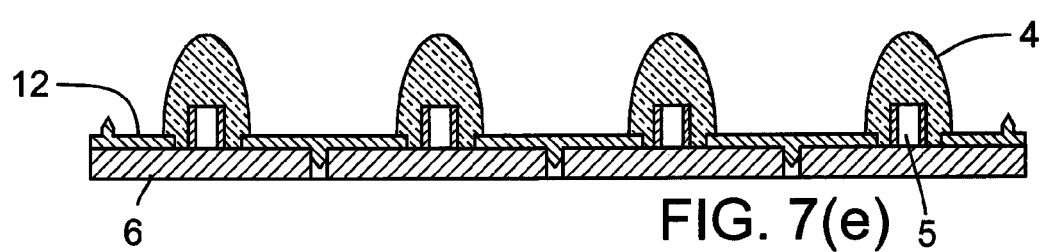

FIG. 5(a) is a schematic top view showing still yet another preferred embodiment of the optical element according to the present invention. FIG. 5(b) is a schematic cross-sectional view taken along the line X4-Y4 in FIG. 5(a). In the optical element shown in FIG. 5, convex portions 31 are formed on the inner wall surface of the through-hole of the plate-like member 2 so that concave portions are formed on at least parts of the inner wall surface. The convex portions 31 are covered by the optical member 4 made of the first resin. Accordingly, the adhesiveness between the optical member 4 and the plate-like member 2 is further improved, and also the optical member 4 does not rotate around the symmetry axis. Moreover, the optical element shown in FIG. 5 includes a concave portion 23 and a straight-lined edge 24 for positioning to a light emitting element 5 to be described later.

<First Method of Manufacturing Resin-Sealed Light Emitting Element>

Next, description will be given of a first method of manufacturing a resin-sealed light emitting element according to the present invention. Specifically, the first method of manufacturing a resin-sealed light emitting element according to the present invention comprises:

a step of preparing a mold having a concave portion for molding a first resin into an optical member in a predetermined shape as well as a plate-like member having through-holes in at least a part thereof and being made of a second resin, and then disposing the plate-like member on the top surface of the mold so that at least one of the through-holes can face the concave portion of the mold (first step);

a step of disposing a light emitting element in the space formed by the concave portion of the mold and the through-hole of the plate-like member (second step);

a step of injecting a liquid precursor of the first resin into the space so that the liquid precursor can come into contact with at least a part of the plate-like member and at least a part of the light emitting element (third step);

a step of polymerizing the liquid precursor while maintaining the contacting state of the liquid precursor with the plate-like member and the light emitting element (fourth step); and a step of integratedly removing, from the mold, the plate-like member, the light emitting element and the optical member made of the first resin which is the polymer of the liquid precursor, thereby to obtain a resin-sealed light emitting element (fifth step).

The first resin and the second resin to be used in the first method of manufacturing a resin-sealed light emitting element according to the present invention can be the same as those used in the above-described method of manufacturing an optical element according to the present invention.

Hereinafter, description will be given of the first method of manufacturing a resin-sealed light emitting element according to the present invention with reference to FIG. 6(a) to FIG. 6(e). FIG. 6(a) to FIG. 6(e) are schematic views showing a preferred embodiment of the first to fifth steps in the first method of manufacturing a resin-sealed light emitting element according to the present invention. FIG. 6(a) illustrates the first step. FIG. 6(b) illustrates the second step. FIG. 6(c) illustrates the third step. FIG. 6(d) illustrates the fourth step. FIG. 6(e) illustrates the fifth step.

In the first step, firstly, prepared are a mold 1 having a concave portion for molding a first resin into an optical member in a predetermined shape as well as a plate-like member 2 having through-holes in at least a part thereof and being made of a second resin. The mold 1 and the plate-like member 2 to be used can be the same as the ones which are used in the above-described method of manufacturing an optical element according to the present invention. In the first step, subsequently, the plate-like member 2 is disposed on the top surface of the mold 1 so that at least one through-hole can face the concave portion of the mold 1 as shown in FIG. 6(a).

Note that, in the first method of manufacturing a resin-sealed light emitting element according to the present invention, when the plate-like member 2 is disposed on the top surface of the mold 1, it is preferable to use first positioning means provided to the plate-like member 2 and the mold 1 for determining the positions of the mold 1 and the plate-like member 2 relative to each other in order to dispose the plate-like member 2 in a predetermined position. Thus, it is possible to efficiently and reliably perform the positioning of the plate-like member 2 and the optical member molded with the mold 1 to be described below. Moreover, the first positioning means are not particularly limited to a certain kind, and may be optically readable alignment marks, or may be made of the combination of a concave portion and a convex portion which fit to each other in a predetermined position.

In the second step, as shown in FIG. 6(b), a light emitting element 5 is disposed in the space formed by the concave portion of the mold 1 and the through-hole of the plate-like member 2. As the light emitting element 5, although a known light emitting element, such as a light emitting diode element, an organic electroluminescent element and a laser diode, can be used, a light emitting diode element is preferable to be used. Moreover, the light emitting element 5 may be fixed to the surface of an element substrate 6 as shown in FIG. 6(b).

Note that, in the first method of manufacturing a resin-sealed light emitting element according to the present invention, when the light emitting element 5 is disposed in the space formed by the concave portion of the mold 1 and the through-hole of the plate-like member 2, it is preferable to use second positioning means provided to the light emitting element 5 as well as at least one of the mold 1 and the plate-like member 2 for determining the positions of the plate-like member 2 and the light emitting element 5 relative to each other in order to dispose the light emitting element 5 in a predetermined position. Thus, it is possible to efficiently and reliably perform the positioning of the plate-like member 2 and the light emitting element 5. As a result, it is possible to efficiently and reliably perform the positioning of the light emitting element 5 and an optical member molded with the mold 1 to be described below. Moreover, as the second positioning means, the same means as the first positioning means can be used. Furthermore, the second positioning means may be provided to the part which is integrated to the light emitting element 5. For example, the second positioning means may be provided to the element substrate 6 to which the light emitting element 5 is fixed.

In the third step, firstly, the liquid precursor 3 of the first resin is prepared. As the liquid precursor 3 to be used can be the same as the one which is used in the above-described method of manufacturing an optical element according to the present invention. In the third step, subsequently, the liquid precursor 3 of the first resin is injected into the space so as to come into contact with at least a part of the plate-like member 2 and at least a part of the light emitting element 5 as shown in FIG. 6(c). Note that, the order to perform the third step and the second step is not particularly limited in the first method of manufacturing a resin-sealed light emitting element according to the present invention, and the third step may be performed before the second step.

In the fourth step, the liquid precursor 3 is polymerized while maintaining the contacting state of the liquid precursor 3 with the plate-like member 2 and the light emitting element 5. The polymerization temperature of the liquid precursor 3 varies with the type of the liquid precursor 3 to be used, and thus is not particularly limited. However, from the viewpoint of not causing the change in the plate-like member 2 other than the change in the shape due to the linear expansion, the polymerization temperature is preferably lower than the heat distortion temperature of the second resin by 20° C. or more, and more preferably, within a range of 80° C. to 100° C. Moreover, the polymerization time for the liquid precursor 3 is preferably within a range of 30 minutes to 240 minutes. By polymerizing the liquid precursor 3 as described above, it is possible to mold an optical member 4 made of the first resin, which is the polymer of the liquid precursor 3, and also to bind the plate-like member 2 and the light emitting element 5 to the surface of at least a part of the optical member 4 (see FIG. 6(d)).

In the fifth step, the plate-like member 2, the light emitting element 5 and the optical member 4 made of the first resin, which is the polymer of the liquid precursor 3, are integratedly removed from the mold, and thereby a resin-sealed light emitting element is obtained. Thus, it is possible to obtain a resin-sealed light emitting element which comprises: the light emitting element 5; the optical member 4 embedding the light emitting element 5 therein; and the plate-like member 2 bound to the surface of at least a part of the optical member 4, but not to a light emitting surface of the optical member 4, as shown in FIG. 6(e).

Hereinabove, the description has been given of the preferred embodiment of the first method of manufacturing a resin-sealed light emitting element according to the present invention. However, the first method of manufacturing a resin-sealed light emitting element according to the present invention is not limited to this embodiment. For example, in the first method of manufacturing a resin-sealed light emitting element according to the present invention, used may be: the element substrate 6 (for example, an array element substrate) to which multiple light emitting elements 5 are fixed in a predetermined alignment; an array mold 11 in which multiple concave portions corresponding to the alignment of the light emitting elements 5 are formed; and an array plate-like member 12 in which multiple through-holes are formed corresponding to the alignment of the light emitting elements 5. Accordingly, in the second step, the multiple light emitting elements 5 fixed to the surface of the element substrate 6 in a predetermined alignment may be disposed in the multiple spaces formed by the concave portions of the array mold 11 corresponding to the alignment of the light emitting elements 5 and the through-holes of the array plate-like member 12. Thus, by using the array mold 11, the plate-like member 12 and the element substrate 6, in which the multiple light emitting elements 5 are fixed in a predetermined alignment, it is possible to manufacture a planar light source device in which the multiple resin-sealed light emitting elements are fixed to the surface of the element substrate 6 in a predetermined alignment (see FIG. 7(a) to FIG. 7(e)).

Furthermore, in the first method of manufacturing a resin-sealed light emitting element according to the present invention, the plate-like member 2 is preferably provided with a convex portion formed at least a part on the inner wall surface of the through-hole. Moreover, in a case where such a plate-like member 2 is used, when the liquid precursor 3 of the first resin is injected into the space formed by the concave portion of the mold and the through-hole of the plate-like member 2, it is preferable to inject the liquid precursor 3 of the first resin into the space so that the liquid precursor 3 of the first resin can cover the convex portion formed on the inner wall surface of the through-hole. Thus, it is possible to further improve the adhesiveness between the optical member 4 and the plate-like member 2.

<Second Method of Manufacturing Resin-Sealed Light Emitting Element>

Next, description will be given of a second method of manufacturing a resin-sealed light emitting element according to the present invention. Specifically, the second method of manufacturing a resin-sealed light emitting element according to the present invention comprises:

a step of obtaining the optical element by the above-described method of manufacturing an optical element (first step);

a step of disposing the light emitting element to one surface of the optical member made of the first resin in the optical element with a liquid precursor of the first resin interposed therebetween (second step); and a step of polymerizing the liquid precursor thereby to obtain a resin-sealed light emitting element (third step).

The first resin to be used in the second method of manufacturing a resin-sealed light emitting element according to the present invention can be the same as that used in the above-described method of manufacturing an optical element according to the present invention.

Figure 8A:
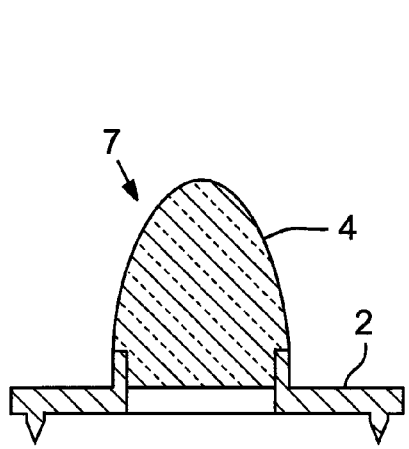
FIG. 8 is a schematic view showing the steps of a preferred embodiment of a second method of manufacturing a resin-sealed light emitting element according to the present invention (FIG. 8(a) corresponds to the first step.
FIG. 8(b) corresponds to the second step.
FIG. 8(c) corresponds to the third step).
Figure 8B:
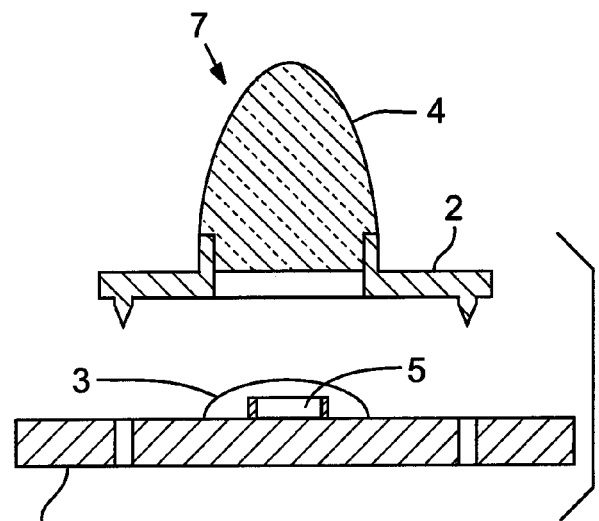
Figure 8C:
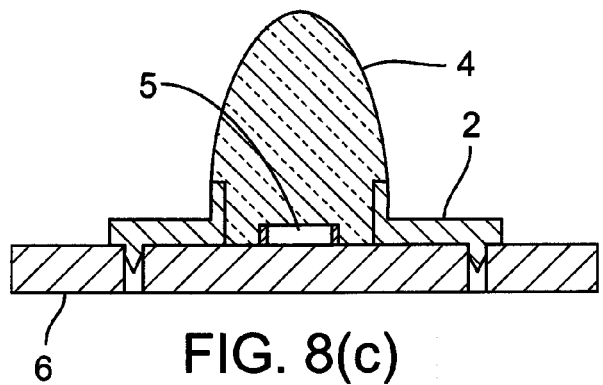

Hereinafter, description will be given of the second method of manufacturing a resin-sealed light emitting element according to the present invention with reference to FIG. 8(a) to FIG. 8(c). FIG. 8(a) to FIG. 8(c) are schematic views showing a preferred embodiment of the first to third steps in the second method of manufacturing a resin-sealed light emitting element according to the present invention. FIG. 8(a) illustrates the first step. FIG. 8(b) illustrates the second step. FIG. 8(c) illustrates the third step.

In the first step, by the above-described method of manufacturing an optical element, obtained is an optical element 7 which comprises: an optical member 4; and a plate-like member 2 bound to the surface of at least a part of the optical member 4, but not to a light emitting surface of the optical member 4, as shown in FIG. 8(a).

In the second step, as shown in FIG. 8(b), a light emitting element 5 is disposed to one surface of the optical member 4 made of the first resin in the optical element 7 with a liquid precursor 3 of the first resin interposed therebetween. As the light emitting element 5, although a known light emitting element, such as a light emitting diode element, an organic electroluminescent element and a laser diode, can be used, a light emitting diode element is preferably used. Moreover, the light emitting element 5 may be fixed to the surface of the element substrate 6 as shown in FIG. 8(b).

Note that, in the second method of manufacturing a resin-sealed light emitting element according to the present invention, when the light emitting element 5 is disposed to one surface of the optical member 4, it is preferable to use second positioning means provided to the light emitting element 5 and the plate-like member 2 made of a second resin in the optical element 7 for determining the positions of the plate-like member 2 and the light emitting element 5 relative to each other in order to dispose the light emitting element 5 in a predetermined position. Thus, it is possible to efficiently and reliably perform the positioning of the plate-like member 2 and the light emitting element 5. As a result, it is possible to efficiently and reliably perform the positioning of the optical member 4 and the light emitting element 5. Moreover, the second positioning means may be optically readable alignment marks, or may be made of the combination of a concave portion and a convex portion which engage with each other in a predetermined position. Furthermore, the second positioning means may be made of the combination of a straight-lined edge provided to at least a part of the plate-like member and the shape which engages with the straight-lined edge. These positioning means can be used alone or in combination of two or more kinds. The second positioning means may be provided to a part which is integrated to the light emitting element 5. For example, the second positioning means may be provided to the element substrate 6 to which the light emitting element 5 is fixed.

In the third step, the liquid precursor 3 is polymerized to obtain a resin-sealed light emitting element. The polymerization temperature of the liquid precursor 3 varies with the type of the liquid precursor 3 to be used, and thus is not particularly limited. However, from the viewpoint of not causing the change in the plate-like member 2 other than the change in the shape due to the linear expansion, the polymerization temperature is preferably lower than the heat distortion temperature of the second resin by 20° C. or more, and more preferably within a range of 80° C. to 100° C. Moreover, the polymerization time for the liquid precursor 3 is preferably within a range of 30 minutes to 240 minutes. By polymerizing the liquid precursor 3 as described above, it is possible to obtain a resin-sealed light emitting element which comprises: the light emitting element 5; the optical member 4 embedding the light emitting element 5 therein; and the plate-like member 2 bound to the surface of at least a part of the optical member 4, but not to the light emitting surface of the optical member 4, as shown in FIG. 8(c).

Hereinabove, the description has been given of the preferred embodiment of the second method of manufacturing a resin-sealed light emitting element according to the present invention. However, the second method of manufacturing a resin-sealed light emitting element according to the present invention is not limited to this embodiment. For example, in the second method of manufacturing a resin-sealed light emitting element according to the present invention, by using an element substrate 6 (for example, an element array substrate) to which multiple light emitting elements 5 are fixed in a predetermined alignment and multiple optical elements 7, the multiple light emitting elements 5 may be disposed in corresponding surfaces of the optical members 4 in the multiple optical elements 7 with liquid precursors 3 of the first resin interposed therebetween in the second step. Thus, it is possible to manufacture a planar light source device in which the multiple resin-sealed light emitting elements are fixed to the surface of the element substrate 6 in a predetermined alignment.

<Optical Element>

Next, description will be given of an optical element according to the present invention. Specifically, the optical element according to the present invention is for a resin-sealed light emitting element, and comprises: an optical member made of a first resin; and a plate-like member which is bound to a surface of at least a part of the optical member, but not to a light emitting surface of the optical member, and which is made of a second resin. The refractive index of the first resin is 1.6 to 1.8, and the second resin is a thermoplastic resin. Such an optical element can be obtained with the method of manufacturing an optical element according to the present invention.

The optical member in the optical element according to the present invention is made of the first resin. It is necessary for the first resin to be a resin having a refractive index within a range of 1.6 to 1.8. When the refractive index of the first resin is less than 1.6, the focal length of the optical member is increased, and thereby the optical system is over-sized. Meanwhile, when the refractive index exceeds 1.8, such a resin is not practical to be used since the sulfur content is increased in order to increase the refractive index, resulting in the reduction in the heat resistance and light resistance of the resin. The first resin including the characteristics mentioned above can be, for example, a thiourethane resin or an episulfide resin. These resins can be used alone or in combination of two or more kinds as the first resin.

The plate-like member in the optical element according to the present invention is bound to the surface of at least a part of the optical member, but not to the light emitting surface of the optical member, and which is made of the second resin. From the viewpoint of the productivity, it is only necessary that the second resin be a thermosetting resin capable of forming a plate-like member by the injection-molding method. Nevertheless, from the viewpoint of not causing the change in the plate-like member other than the change in the shape due to the linear expansion, a thermosetting resin with a heat distortion temperature of 100° C. or higher is preferable at the time of manufacturing a resin-sealed light emitting element. Note that, the heat distortion temperature can be measured in accordance with the method described in ASTM D648 or the method described in JIS K7191-1 and 2. The second resin including the above-mentioned characteristics can be, for example, a polycarbonate resin (PC), a polyphenylene sulfide resin (PPS), a norbornene resin, a cyclic olefin copolymer, an alicyclic acrylic resin, a polyacetal, a polybutylene terephthalate, a modified polyphenylene oxide, and an ultra high molecular weight polyethylene. These resins can be used alone or in combination of two or more kinds as the second resin.

Furthermore, from the viewpoint of the adhesiveness between the first resin and the second resin in the optical element according to the present invention, the first resin is preferably at least one resin selected from the group consisting of a thiourethane resin and an episulfide resin. Meanwhile, the second resin is preferably at least one resin selected from the group consisting of a polycarbonate resin, an alicyclic acrylic resin and a polybutylene terephthalate. The first resin is particularly preferably an episulfide resin, and the second resin is particularly preferably a polycarbonate resin.

Moreover, these first and second resins may contain a dye to reduce yellow or red coloring due to the initial color defect or light irradiation, an ultraviolet absorbent, an antioxidant, an internal mold release agent, an internal adhesive improver, a polymerization catalyst, and other known performance-improving additives as necessary.

Furthermore, in the optical element according to the present invention, the plate-like member preferably includes optically readable alignment marks, or includes a concave portion or a convex portion for positioning. Accordingly, the plate-like member includes the optically readable alignment marks, or the concave portion or convex portion for positioning as described above. With this plate-like member, it tends to be possible to efficiently and reliably perform the positioning of the optical member and the light emitting element at the time of manufacturing a resin-sealed light emitting element by use of the optical element according to the present invention.

Still furthermore, in the optical element according to the present invention, the plate-like member preferably has a through-hole in at least a part thereof, and then is bound to the optical member in at least a part of the inner wall surface of the through-hole. Additionally, the plate-like member more preferably has a convex portion formed on at least a part of the inner wall surface of the through-hole. With the convex portion formed on at least a part of the inner wall surface of the through-hole provided in the plate-like member the adhesiveness between the optical member and the plate-like member tends to be improved.

<Resin-Sealed Light Emitting Element and Planar Light Source Device>

Next, description will be given of a resin-sealed light emitting element and a planar light source device according to the present invention. Specifically, the resin-sealed light emitting element according to the present invention comprises: a light emitting element; an optical member which embeds the light emitting element therein, and which is made of a first resin; and a plate-like member which is bound to a surface of at least a part of the optical member, but not to a light emitting surface of the optical member, and which is made of a second resin. The refractive index of the first resin is 1.6 to 1.8, and the second resin is a thermoplastic resin.

In addition, the planar light source device according to the present invention comprises an element substrate and the resin-sealed light emitting element. In the planar light source device, the multiple resin-sealed light emitting elements are fixed to the surface of the element substrate in a predetermined alignment.

The resin-sealed light emitting element and the planar light source device can be obtained with the above-described first or second method of manufacturing a resin-sealed light emitting element according to the present invention.

As the light emitting element in the resin-sealed light emitting element and the planar light source device according to the present invention, a known light emitting element, such as a light emitting diode element, an organic electroluminescent element and a laser diode, can be used, although a light emitting diode element is preferably used.

Moreover, in the resin-sealed light emitting element and the planar light source device according to the present invention, the optical member embeds the light emitting element therein, and is made of a first resin. Furthermore, the plate-like member in the resin-sealed light emitting element and the planar light source device according to the present invention is a member in a plate form, which is bound to the surface of at least a part of the optical member, but not to the light emitting surface of the optical member, and which is made of the second resin. The first resin and the second resin can be the same resins used for the above-described optical element according to the present invention.

Still furthermore, in the resin-sealed light emitting element and the planar light source device according to the present invention, the plate-like member preferably has a through-hole in at least a part thereof, and then is bound to the optical member in at least a part of the inner wall surface of the through-hole. Additionally, the plate-like member more preferably has a convex portion formed on at least a part of the inner wall surface of the through-hole. With the convex portion formed on at least a part of the inner wall surface of the through-hole provided in the plate-like member, the adhesiveness between the optical member and the plate-like member tends to be improved.

EXAMPLES

Hereinafter, the present invention will be more specifically described on the basis of examples. However, the present invention is not limited to the following examples.

Example 1

Figure 9A:
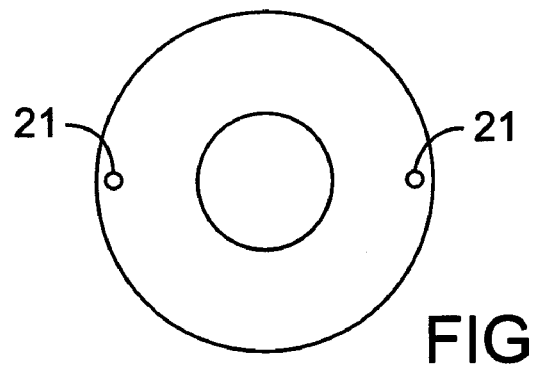
FIG. 9(a) is a schematic top view.
Figure 9B:
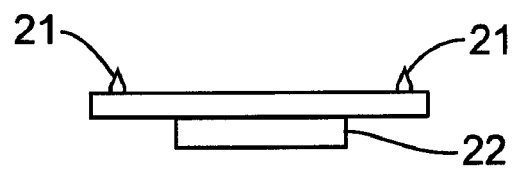
FIG. 9(b) is a schematic cross-sectional view.
Figure 9C:
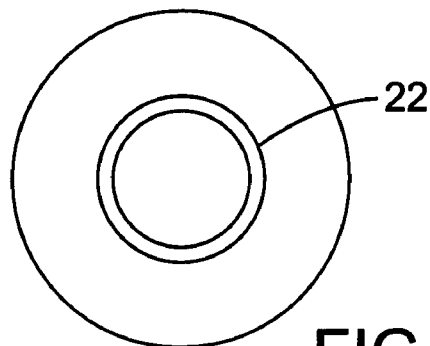
FIG. 9(c) is a schematic bottom view, showing a preferred embodiment of a plate-like member used in Example 1.

Firstly, polycarbonate (from TEIJIN CHEMICALS LTD., product name "Panlite® AD-5503", heat distortion temperature: 130° C.) is injection-molded to obtain the plate-like member 2. FIG. 9 shows the plate-like member 2 thus obtained. FIG. 9(a) is a schematic top view, FIG. 9(b) is a schematic cross-sectional view, and FIG. 9(c) is a schematic bottom view, showing a preferred embodiment of the plate-like member 2. The plate-like member 2 shown in FIG. 9 includes: through-holes in at least a part thereof; the convex portions 21 for the positioning to the light emitting element 5; and a convex portion 22 for the positioning to the mold 1.

Next, the mold 1 having concave portions is prepared, and the mold 1 is provided with a concave portion corresponding to the convex portion 22 for the positioning. Then, the positioning is performed using the combination of the concave and convex portions which are respectively provided to the mold 1 and the plate-like member 2, and which are fitted into each other in a predetermined position. At this time, the plate-like member 2 is disposed on the top surface of the mold 1 so that at least one through-hole can face the concave portion of the mold 1. Subsequently, the liquid precursor 3 of the episulfide resin is prepared, and the liquid precursor 3 is injected to the space formed by the concave portion of the mold 1 and the through-hole of the plate-like member 2 so as to come into contact with at least a part of the plate-like member 2.

Next, the liquid precursor 3 is polymerized at a temperature of 100° C. for 60 minutes while maintaining the contacting state of the liquid precursor 3 with the plate-like member 2 to form the optical member 4 made of the episulfide resin which is the polymer of the liquid precursor 3. Thereafter, the optical member 4 and the plate-like member 2 are integratedly removed from the mold 1 to obtain the optical element 7 according to the present invention. The refractive index of the optical member 4 in the obtained optical element 7 is 1.74.

After that, prepared is the element substrate 6 to which the light emitting element 5 (light emitting diode element) is fixed. The element substrate 6 is provided with a concave portion corresponding to the convex portion 21 for the positioning. Then, the positioning is performed using the combination of the concave and convex portions which are provided to the plate-like member 2 and the element substrate 6, and which are fitted into each other in predetermined positions. At this time, the light emitting element 5 is disposed on one surface of the optical member 4 in the optical element 7 with the liquid precursor 3 interposed therebetween. Subsequently, the liquid precursor 3 is polymerized at a temperature of 100° C. for 60 minute thereby to obtain a resin-sealed light emitting element according to the present invention.

Example 2

Firstly, prepared is the element substrate 6 to the surface of which the multiple light emitting elements 5 (light emitting diode elements) are fixed in a predetermined alignment. Moreover, prepared is the mold 1 having multiple concave portions corresponding to the predetermined alignment. Furthermore, an alicyclic olefin resin (from ZEON Corporation, product name "ZEONEX®-480R", heat distortion temperature: 120° C.) is injection-molded to obtain the plate-like member 2 having multiple through-holes corresponding to the predetermined alignment. Then, optically readable alignment marks are provided to predetermined positions of the element substrate 6, the mold 1 and the plate-like member 2.

Next, the positioning is performed using the optically readable alignment marks provided to the mold 1 and the plate-like member 2. At this time, the plate-like member 2 is disposed on the top surface of the mold 1 so that the multiple through-holes corresponding to the predetermined alignment can face the multiple concave portions corresponding to the predetermined alignment of the mold 1. Subsequently, the positioning is performed using the optically readable alignment marks provided to the plate-like member 2 and the element substrate 6. At this time, the multiple light emitting elements 5 fixed on the element substrate 6 in the predetermined alignment are disposed in the multiple spaces formed by the concave portions of the mold 1 and the through-holes of the plate-like member 2 provided so as to correspond to the alignment of the light emitting elements 5.

After that, prepared is the liquid precursor 3 of the thiourethane resin (from Mitsui Chemicals Inc., product name "MR-7"). The liquid precursor 3 is injected into the space formed by the concave portions of the mold 1 and the through-holes of the plate-like member 2 so as to come into contact with at least a part of the plate-like member 2 and at least a part of the light emitting elements 5. Then, the liquid precursor 3 is polymerized at a temperature of 100° C. for 120 minutes while maintaining the contacting state of the liquid precursor 3 with the plate-like member 2 and the light emitting elements 5 to form the optical members 4 made of the thiourethane resin which is the polymer of the liquid precursor 3. Subsequently, the optical members 4, the plate-like member 2 and the light emitting elements 5 are integratedly removed from the mold 1 to obtain a planar light source device according to the present invention. Note that the refractive index of the optical member 4 in the obtained planar light source device is 1.67.

Example 3

Firstly, an alicyclic olefin resin (from Mitsui Chemicals Inc., product name "APL5014DP", heat distortion temperature: 120° C.) is injection-molded to obtain the plate-like member 2 having through-holes at least a part thereof, and having a convex portion formed on at least a part of the inner wall surface of the through-holes. Then, the mold 1 having concave portions is prepared, and the plate-like member 2 is disposed on the top surface of the mold 1 so that at least one through-hole can face the concave portion of the mold 1. Subsequently, the liquid precursor 3 of the episulfide resin is prepared, and the liquid precursor 3 is injected into the space formed by the concave portion of the mold 1 and the through-hole of the plate-like member 2 so as to come into contact with at least a part of the plate-like member 2.

Figure 10:
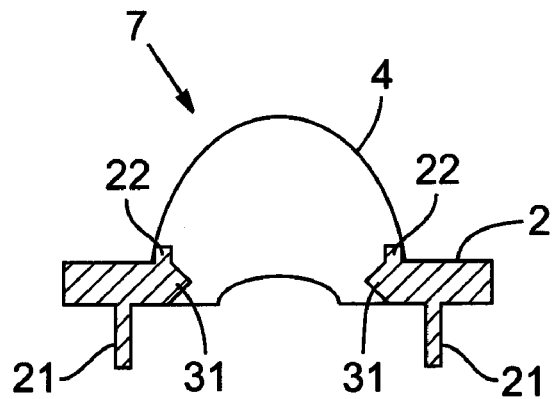
FIG. 10 is a schematic cross-sectional view showing a preferred embodiment of an optical element used in Example 3.

Next, the liquid precursor 3 is polymerized at a temperature of 100° C. for 60 minutes while maintaining the contacting state of the liquid precursor 3 with the plate-like member 2 to form the optical member 4 made of the episulfide resin which is the polymer of the liquid precursor 3. Thereafter, the optical member 4 and the plate-like member 2 are integratedly removed from the mold 1 to obtain the optical element 7 according to the present invention. The refractive index of the optical member 4 in the obtained optical element 7 is 1.74. FIG. 10 shows the optical element 7 thus obtained. In the optical element 7 shown in FIG. 10, the plate-like member 2 has a through-hole in at least a part thereof, and the convex portions 31 are formed on the inner wall surface of the through-hole. Moreover, the convex portions 31 are covered by the optical member 4. Furthermore, in the optical element 7 shown in FIG. 10, the plate-like member 2 includes: the convex portions 21 for the positioning to the light emitting element 5; and the convex portions 22 for the positioning to the mold 1.

After that, prepared is the element substrate 6 to which the light emitting element 5 (light emitting diode element) is fixed. The element substrate 6 is provided with the concave portion corresponding to the convex portion 21 for the positioning. Then, the positioning is performed using the combination of the concave and convex portions which are provided to the plate-like member 2 and the element substrate 6, and which are fitted into each other in predetermined positions. At this time, the light emitting element 5 is disposed on one surface of the optical member 4 in the optical element 7 with the liquid precursor 3 interposed therebetween. Subsequently, the liquid precursor 3 is polymerized at a temperature of 100° C. for 60 minute thereby to obtain a resin-sealed light emitting element according to the present invention.

As described hereinabove, according to the present invention, it is possible to provide, for example: a method of manufacturing a resin-sealed light emitting element by which an operation, such as the positioning of a light emitting element and an optical member, can be achieved efficiently and reliably; a resin-sealed light emitting element and a planar light source device obtained by the method; an optical element which can be suitable for being used in the method; and a manufacturing method of the optical element.

What is claimed is:

1. A method of manufacturing an optical element, comprising the steps of:
   preparing a mold having a top surface and at least one concave portion for molding a first resin into an optical member in a predetermined shape;
   preparing a plate-like member for positioning of the optical member relative to a light emitting element that is fixed to a surface of an element substrate, the plate-like member being made of a second resin and defining at least one through-hole in a respective part of the plate-like member;
   disposing the plate-like member on the top surface of the mold so that the at least one through-hole faces a corresponding concave portion and forms, with the concave portion, a respective at least one space;
   introducing a liquid precursor of the first resin into the at least one space such that the liquid precursor fills the respective concave portions and contacts at least a part of the plate-like member in the space;
   while maintaining contact of the liquid precursor with the plate-like member, polymerizing the liquid precursor into the first resin to form at least one optical member of the first resin; and
   integratedly removing, from the mold, the plate-like member and the at least one optical member to obtain at least one optical element.

2. The method of claim 1, wherein the step of disposing the plate-like member on the top surface of the mold is performed so that a plurality of through-holes of the plate-like member can respectively face a plurality of concave portions of the mold.

3. The method of claim 1, wherein, when the plate-like member is disposed on the top surface of the mold, the plate-like member is disposed in a predetermined position using first positioning means which are provided to the plate-like member and the mold, and which determine the positions of the concave portion of the mold and the plate-like member relative to each other.

4. The method of claim 3, wherein the first positioning means comprises optically readable alignment marks.

5. The method of claim 3, wherein the first positioning means comprises a combination of a concave portion and a convex portion which fit to each other in a predetermined position.

6. The method of claim 1, wherein:
   the at least one through-hole comprises an inner wall surface; and
   the plate-like member comprises a convex portion formed on at least a part of the inner wall surface.

7. The method of claim 6, wherein, when the liquid precursor of the first resin is introduced into the space formed by the concave portion of the mold and the through-hole of the plate-like member, the liquid precursor enters the space and covers the convex portion formed on the inner wall surface.

8. A method of manufacturing a resin-sealed light emitting element, comprising the steps of:
   preparing a mold having a top surface and at least one concave portion for molding a first resin into an optical member in a predetermined shape;
   providing a plate-like member for use as a positioning aid for positioning the optical member relative to a light emitting element that is fixed to a surface of an element substrate, the plate-like member being made of a second resin and defining at least one through-hole in a respective part of the plate-like member;
   disposing the plate-like member on the top surface of the mold so that the at least one through-hole faces a corresponding concave portion and forms, with the concave portion, a respective at least one space;
   using the plate-like member as a positioning aid, disposing a respective light emitting element, fixed to the surface of the element substrate, in the at least one space;
   introducing a liquid precursor of the first resin into the at least one space such that the liquid precursor fills the concave portion and contacts at least a part of the plate-like member and at least a part of the light emitting element in the space;
   while maintaining contact of the liquid precursor with the plate-like member and the light emitting element, polymerizing the liquid precursor into the first resin to form at least one optical member of the first resin; and
   integratedly removing, from the mold, the plate-like member, the light emitting element, and the optical member to obtain at least one resin-sealed light emitting element.

9. The method of claim 8, wherein the step of disposing the plate-like member on the top surface of the mold comprises disposing a plurality of through-holes defined by the plate-like member to respective positions in which each through-hole faces a respective concave portion.

10. The method of claim 9, wherein the step of disposing a light emitting element comprises disposing a plurality of light emitting elements, fixed on an element substrate, in a predetermined alignment in a plurality of spaces formed by respective concave portions of the mold and respective through-holes of the plate-like member, the spaces corresponding to the alignment of the light emitting elements.

11. The method of claim 8, wherein the light emitting element is a light emitting diode element.

12. The method of claim 8, wherein, when the plate-like member is disposed on the top surface of the mold, the plate-like member is disposed in a predetermined position using first positioning means which are provided to the plate-like member and the mold, and which determine the positions of the concave portion of the mold and the plate-like member relative to each other.

13. The method of claim 8, wherein, when the light emitting element is disposed in the respective space, the light emitting element is disposed in a predetermined position using second positioning means which are provided to the light emitting element as well as to at least one of the mold and the plate-like member, and which determine the positions of the plate-like member and the light emitting element relative to each other.

14. The method of claim 13, wherein the second positioning means comprises a combination of a concave portion and a convex portion which fit to each other in a predetermined position.

15. The method of claim 8, wherein:
   the at least one through-hole comprises an inner wall surface; and
   the plate-like member comprises a convex portion formed on at least a part of the inner wall surface.

16. The method of claim 15, wherein, when the liquid precursor of the first resin is introduced into the space formed by the concave portion of the mold and the through-hole of the plate-like member, the liquid precursor enters the space and covers the convex portion formed on the inner wall surface.

17. A method of manufacturing a resin-sealed light emitting element, comprising the steps of:
   preparing a mold having a top surface and at least one concave portion for molding a first resin into an optical member in a predetermined shape;

preparing a plate-like member made of a second resin and defining at least one through-hole in a respective part of the plate-like member, the plate-like member being configured for use as a positioning aid for positioning the optical member relative to a light emitting element that is fixed to a surface of an element substrate;

disposing the plate-like member on the top surface of the mold so that the at least one through-hole faces a corresponding concave portion and forms, with the concave portion, a respective at least one space;

introducing a liquid precursor of the first resin into the at least one space such that the liquid precursor fills the respective concave portions and contacts at least a part of the plate-like member in the space;

while maintaining contact of the liquid precursor with the plate-like member, polymerizing the liquid precursor into the first resin to form at least one optical member of the first resin;

integratedly removing, from the mold, the plate-like member and the at least one optical member to obtain at least one optical element;

using the plate-like member as a positioning aid, disposing a light emitting element, mounted to a surface of an element substrate, to one surface of the optical member of the at least one optical element with a liquid precursor of the first resin being interposed between the light emitting element and the surface; and polymerizing the interposed liquid precursor to obtain a resin-sealed light emitting element.

18. The method of claim 17, wherein disposing the light emitting element to the surface of the optical member comprises disposing the light emitting element in a predetermined position using positioning means provided to the light emitting element and the plate-like member in the optical element, the positioning means being for determining positions of the plate-like member and the light emitting element relative to each other.

19. The method of claim 18, wherein the positioning means comprises a combination of a concave portion and a convex portion which fit to each other in a predetermined manner.

20. The method of claim 18, wherein the positioning means comprises a combination of a straight-lined edge provided to at least a part of the plate-like member and a shape which fits to the straight-lined edge.

21. An optical element for a resin-sealed light emitting element, comprising:
an optical member made of a first resin;
a plate-like member comprising positioning means for positioning the optical member relative to a light emitting element fixed to a surface of an element substrate, the plate-like member being bonded to a surface of at least a part of the optical member, but not to a light emitting surface thereof, the plate-like member being made of a second resin; wherein
the first resin has a refractive index of 1.6 to 1.8, and the second resin is a thermoplastic resin.

22. The optical element of claim 21, wherein the positioning means comprises at least one alignment mark, at least one concave portion engaged with a complementary convex portion, at least one straight edge engaged with a complementary edge, or a combination thereof.

23. The optical element of claim 21, wherein:
the plate-like member defines a through-hole in at least a part thereof, the through-hole having an inner wall surface; and
at least a part of the inner wall surface is bonded to the optical member.

24. The optical element of claim 23, wherein the plate-like member comprises a convex portion formed on at least a part of the inner wall surface.

25. A resin-sealed light emitting element, comprising:
a light emitting element fixed to a surface of an element substrate;
an optical member in which the light emitting element is embedded, the optical member being made of a first resin; and
a plate-like member comprising positioning means for positioning the optical member relative to the light emitting element, the plate-like member being bonded to a portion of the surface, but not to a light emitting portion of the surface, the plate-like member being made of a second resin;
wherein the first resin has a refractive index of 1.6 to 1.8, and the second resin is a thermoplastic resin.

* * * * *